(12) United States Patent
Fakhruddin et al.

(10) Patent No.: US 9,462,674 B1
(45) Date of Patent: Oct. 4, 2016

(54) CIRCUITS FOR AND METHODS OF PROVIDING A CHARGE DEVICE MODEL GROUND PATH USING SUBSTRATE TAPS IN AN INTEGRATED CIRCUIT DEVICE

(71) Applicant: Xilinx, Inc., San Jose, CA (US)

(72) Inventors: Mohammed Fakhruddin, San Jose, CA (US); James Karp, Saratoga, CA (US); Kuok-Khian Lo, Cupertino, CA (US)

(73) Assignee: XILINX, INC., San Jose, CA (US)

( * ) Notice: Subject to any disclaimer, the term of this patent is extended or adjusted under 35 U.S.C. 154(b) by 523 days.

(21) Appl. No.: 14/010,059

(22) Filed: Aug. 26, 2013

(51) Int. Cl.
*G06F 17/50* (2006.01)
*H03K 19/003* (2006.01)
*H05K 1/02* (2006.01)
*H05K 3/10* (2006.01)

(52) U.S. Cl.
CPC .............. *H05K 1/0213* (2013.01); *H05K 3/10* (2013.01); *G06F 17/5054* (2013.01); *G06F 17/5068* (2013.01); *G06F 17/5072* (2013.01); *H03K 19/003* (2013.01)

(58) Field of Classification Search
CPC ........... G06F 17/5054; G06F 17/5068; G06F 17/5072; H03K 19/003–19/00369
USPC ................. 716/116–117, 118–119, 121–122; 326/37–38, 41, 47–50
See application file for complete search history.

(56) References Cited

U.S. PATENT DOCUMENTS

| | | | |
|---|---|---|---|
| 5,309,012 A * | 5/1994 | Jex | H01L 27/115 257/314 |
| 5,404,041 A | 4/1995 | Diaz et al. | |
| 5,506,437 A | 4/1996 | May et al. | |
| 5,714,784 A | 2/1998 | Ker et al. | |
| 6,005,797 A | 12/1999 | Porter et al. | |
| 6,446,250 B1 | 9/2002 | Becker | |
| 6,550,047 B1 | 4/2003 | Becker | |
| 6,614,078 B2 | 9/2003 | Lee et al. | |
| 6,730,947 B2 | 5/2004 | Kumazawa | |
| 6,882,224 B1 | 4/2005 | Gaboury et al. | |
| 6,956,266 B1 | 10/2005 | Voldman et al. | |
| 7,549,135 B2 | 6/2009 | Chapman et al. | |
| 7,626,243 B2 | 12/2009 | Disney et al. | |
| 7,973,371 B2 | 7/2011 | Furuta et al. | |
| 7,990,664 B1 * | 8/2011 | Perisetty | H01L 27/0277 361/111 |
| 8,004,904 B2 | 8/2011 | Momii | |
| 8,054,597 B2 * | 11/2011 | Gebreselasie | H01L 27/0251 361/111 |
| 8,169,760 B2 * | 5/2012 | Chang | H01L 27/0266 361/111 |
| 8,174,112 B1 | 5/2012 | Karp et al. | |
| 8,559,145 B1 | 10/2013 | Kireev et al. | |
| 8,881,085 B1 | 11/2014 | Karp | |
| 8,891,491 B2 | 11/2014 | Carbonelli et al. | |
| 8,947,839 B2 | 2/2015 | Karp | |

(Continued)

OTHER PUBLICATIONS

Specification and drawings for U.S. Appl. No. 13/686,553, filed Nov. 27, 2012, Jain et al.

(Continued)

*Primary Examiner* — Stacy Whitmore
(74) *Attorney, Agent, or Firm* — John J. King

(57) ABSTRACT

A circuit for providing a ground path in an integrated circuit device is described. The circuit comprises a device region formed in a substrate; a substrate tap formed adjacent to the device region; and a conductive path coupled between the substrate tap and a ground metal layer by way of a plurality of metal layers and vias, wherein the conductive path is configured to meet a predetermined design requirement.

17 Claims, 6 Drawing Sheets

(56) References Cited

U.S. PATENT DOCUMENTS

| | | | |
|---|---|---|---|
| 9,013,844 B2 | 4/2015 | Karp | |
| 9,013,845 B1 | 4/2015 | Karp | |
| 9,058,853 B2 | 6/2015 | Hart et al. | |
| 2002/0031882 A1 | 3/2002 | Uchida | |
| 2003/0174452 A1 | 9/2003 | Chen et al. | |
| 2004/0047094 A1 | 3/2004 | Chen et al. | |
| 2005/0270714 A1* | 12/2005 | Huang | H01L 27/0266 361/91.1 |
| 2005/0275032 A1 | 12/2005 | Kodama et al. | |
| 2005/0289494 A1* | 12/2005 | Kozhaya | G06F 17/5077 716/112 |
| 2006/0142899 A1 | 6/2006 | Wobben | |
| 2006/0226499 A1 | 10/2006 | Shimizu | |
| 2007/0004150 A1 | 1/2007 | Huang et al. | |
| 2007/0080406 A1 | 4/2007 | Snyder et al. | |
| 2008/0029820 A1 | 2/2008 | Disney et al. | |
| 2008/0134104 A1 | 6/2008 | Chapman et al. | |
| 2008/0142899 A1 | 6/2008 | Morris et al. | |
| 2009/0180225 A1 | 7/2009 | Pan et al. | |
| 2010/0264953 A1 | 10/2010 | Lilja | |
| 2011/0049621 A1 | 3/2011 | Lotfi et al. | |
| 2011/0049672 A1* | 3/2011 | Okushima | H01L 23/5227 257/531 |
| 2011/0304010 A1* | 12/2011 | Jiang | H01L 23/3677 257/528 |
| 2012/0162834 A1* | 6/2012 | Yehezkely | H01L 23/60 361/56 |
| 2013/0147011 A1* | 6/2013 | Okushima | H01L 23/5227 257/531 |

OTHER PUBLICATIONS

Dodds, N. A. et al., "Selection of Well Contact Densities for Latchup-Immune Minimal-Area ICs" *IEEE Transactions on Nuclear Science*, Dec. 2010, pp. 3575-3581, vol. 57, No. 6, IEEE, Piscataway, New Jersey, USA.

Klein, Matt, *Power Consumption at 40 and 45 nm*, WP298 (v1.0), Apr. 13, 2009, pp. 1-21, Xilinx, Inc., San Jose, California, USA.

Jan, C.-H., et al., "A 32nm SoC Platform Technology with $2^{nd}$ Generation High-k/Metal Gate Transistors Optimized for Ultra Low Power, High Performance, and High Density Product Applications," Dec. 6, 2009, pp. 28.1.1-28.1.4, *Proc. of the 2009 IEEE International Electron Devices Meeting*, IEEE, Piscataway, New Jersey, USA.

Santarini, Mike, "How Xilinx Halved Power Draw in 7 Series FPGAs," Oct. 1, 2011, pp. 8-11 (6 pp. total), *Xcell Journal*, Issue 76, Xilinx, Inc., San Jose, California, USA.

Shiyanovskii, Yuriy et al., "Effect of Voltage Scaling on Soft Error Protection Methods for SRAMs " *Proc. of the IEEE 2010 National Aerospace and Electronics Conference*, Jul. 14, 2010, pp. 328-333, IEEE, Piscataway, New Jersey, USA.

Specification and drawings from U.S. Appl. No. 12/793,584, filed Jun. 3, 2010, Karp et al.

Specification and drawings from U.S. Appl. No. 13/439,721, filed Apr. 4, 2012, Karp et al.

Specification and drawings from U.S. Appl. No. 13/439,706, filed Apr. 4, 2012, Hart et al.

Specification and drawings from U.S. Appl. No. 13/587,823, filed Aug. 16, 2012, Hart et al.

Allen, Phillip E., *Lecture 80—Latchup & ESD*, Mar. 24, 2010, pp. 080-1 to 080-32, AICDesign.org.

Hsieh, C.M. et al., "A Field-Funneling Effect on the Collection of Alpha-Particle-Generated Carriers in Silicon Devices," *IEEE Electron Device Letters*, Apr. 1981, pp. 103-105, vol. EDL-2, No. 4, IEEE, Piscataway, New Jersey, USA.

Wang, Albert Z.H., *On-Chip ESD Protection for Integrated Circuits: An IC Design Perspective*, Jan. 2002, pp. 74-75, Kluwer Academic Publishers, Boston, Massachusetts, USA.

Ziegler, James F. et al., *SER—History, Trends and Challenges: A Guide for Designing with Memory ICs*, Aug. 19, 2004, pp. 6-3-6-5, Cypress Semiconductor, San Jose, California, USA.

* cited by examiner

US 9,462,674 B1

CIRCUITS FOR AND METHODS OF PROVIDING A CHARGE DEVICE MODEL GROUND PATH USING SUBSTRATE TAPS IN AN INTEGRATED CIRCUIT DEVICE

TECHNICAL FIELD

The present invention relates generally to integrated circuits, and in particular to circuits for and methods of providing a ground path in an integrated circuit device.

BACKGROUND

An electrostatic discharge (ESD) event refers to a temporary and abrupt flow of current between two objects of differing electrical potentials. ESD can be a serious issue for a solid-state electronic integrated circuit (IC) as large potential changes and current flows that occur during the ESD event can damage silicon junctions and oxide insulators. Damage to an IC from the ESD event can diminish the performance of the silicon-based IC, if not render the IC inoperable.

A charge buildup on an IC can occur for a variety of different reasons and can occur during manufacturing, assembly, testing, and/or use of the IC. As a result, the IC can be subjected to inadvertent ESD events prior, and subsequent, to assembly and sale. ESD device testing is used to ascertain the sensitivity of an IC to an ESD event. ESD testing can be performed using a variety of approaches, with each approach attempting to model a different type of ESD event.

One ESD testing approach is based upon a charged device model (CDM). The CDM attempts to duplicate an ESD event that begins with an IC accumulating charge. The charged IC subsequently makes contact with a conductive object and discharges the accumulated charge into the conductive object. For example, during manufacturing, ICs can be charged while sliding down the feeder of an automatic assembler and subsequently discharged upon contact with an insertion head of the assembler.

SUMMARY

A circuit for providing a ground path in an integrated circuit device is described. The circuit comprises a device region formed in a substrate; a substrate tap formed adjacent to the device region; and a conductive path coupled between the substrate tap and a ground metal layer by way of a plurality of metal layers and vias, wherein the conductive path is configured to meet a predetermined design requirement.

A method of providing a ground path in an integrated circuit device is also described. The method comprises forming a design region in a substrate of the integrated circuit device; forming a substrate tap adjacent to the device region in the integrated circuit device; and providing a conductive path between the substrate tap and a ground metal layer by way of a plurality of metal layers and vias of the integrated circuit device, wherein the conductive path is configured to meet a predetermined design requirement.

Another method of providing a ground path in an integrated circuit device may comprise receiving a circuit design having a substrate tap adjacent to device region formed in a substrate of the integrated circuit device and a conductive path extending between the substrate tap and a ground metal layer by way of a plurality of metal layers and vias of the integrated circuit device; extracting a value associated with the conductive path; determining whether the value associated with the conductive path meets a predetermined design requirement; and reconfiguring the circuit design if the conductive path does not meet the predetermined design requirement.

DETAILED DESCRIPTION

Figure 1:
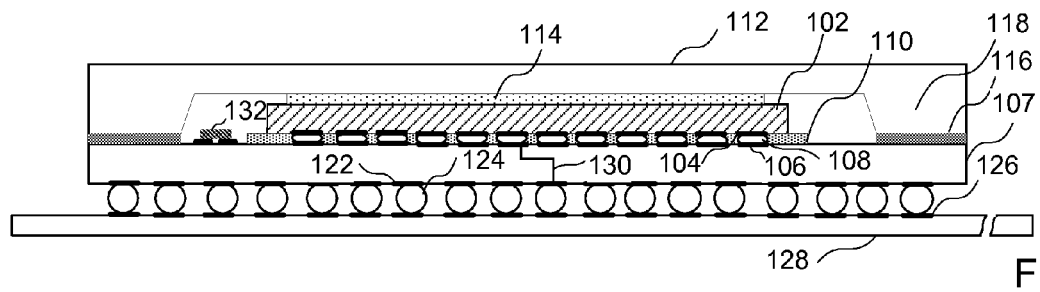
FIG. 1 is a cross-sectional view of an integrated circuit device.

Turning first to FIG. 1, an integrated circuit package comprises a die 102 having a plurality of contact pads 104 enabling connections to contact pads 106 of the substrate 107 by way of corresponding solder bumps 108. An underfill 110 may also be applied under the die 102. A lid 112 is then attached to the substrate by way of a bonding agent 114 between the die and the lid, and a bonding agent 116 between a side wall 118 of the lid and the substrate. Contact pads 122 on the substrate are also provided to make an electrical connection by way of solder balls 124 between the substrate and another device. For example, the solder balls may make a connection to contact pads 126 of a printed circuit board 128. Interconnects 130, which may comprise traces of various metal layers separated by dielectric layers and vias between the traces, for example, enable an electrical connection between solder bumps 108 and solder balls 124. One or more discrete components 132, such as resistors or capacitors, may be placed on the substrate and connected to the die by interconnects.

Figure 2:
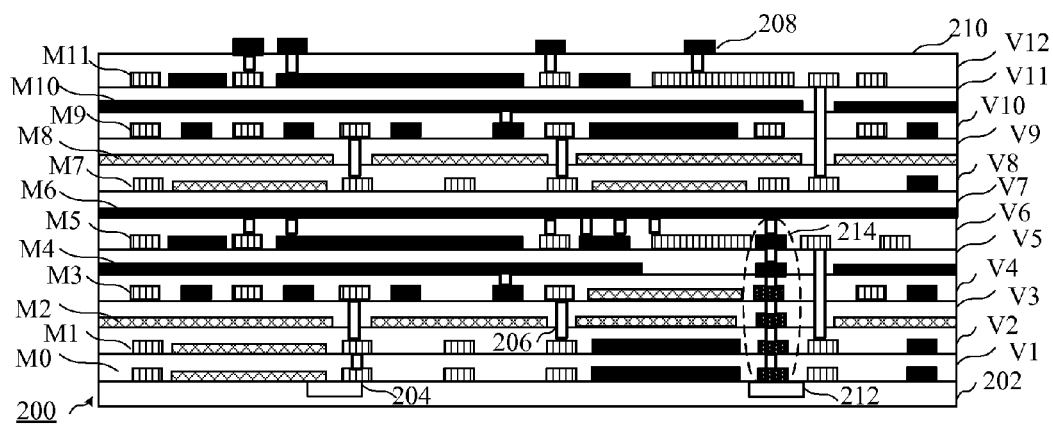
FIG. 2 is a cross-sectional view showing metal layers formed on an integrated circuit substrate.

Turning now to FIG. 2, a cross-sectional view shows an integrated circuit having a plurality of metal layers. As shown in FIG. 2, metal layers having conductive traces for different signal types are provided. By way of example, a ground trace is indicated in solid black, a signal trace is indicated by cross-hatched lines, and a power voltage trace is indicted by vertical lines. The integrated circuit includes a substrate 202 having circuit elements 204 which are coupled to various interconnect elements formed in a first metal layer M0 on the surface of the substrate 202. Vias 206 may be implemented to enable the connection of various traces to traces in other layers. The metal layers are separated by a dielectric layers, shown here as the white material not occupied by the metal traces or vias formed in the dielectric material of the dielectric layers. External contacts 208 may be implemented as input/output (I/O) contacts on a top surface 210 of the integrated circuit as shown for enabling the input and output of data associated with the circuit elements 204 and providing reference voltages, such as power and ground to the circuit elements. Also shown in FIG. 2 is a substrate tap 212 coupled to a metal layer M6 by way of a ground path 214. As will be described in more detail below, metal layer M6 may be a VSS ground plane, which may be connected to a ground contact on the surface 210 by way of metal layers and vias above metal layer M6.

The integrated circuit of FIG. 2 as shown comprises 12 metal layers M0-M11, and 12 corresponding via layers V1-V12. The various metal layers may have different thicknesses, and therefore different resistances, as will also be described in more detail below. For example, the metal layers below the metal layer M6 may generally have a greater resistance than the metal layers above metal layer M6, and therefore will be more significant in the calculation of the resistance in a path between the substrate tap 212 and a ground contact, such as external contact 208. While 12 metal layers and corresponding via layers are shown, it should be understood that greater or fewer layers could be implemented.

Figure 3:
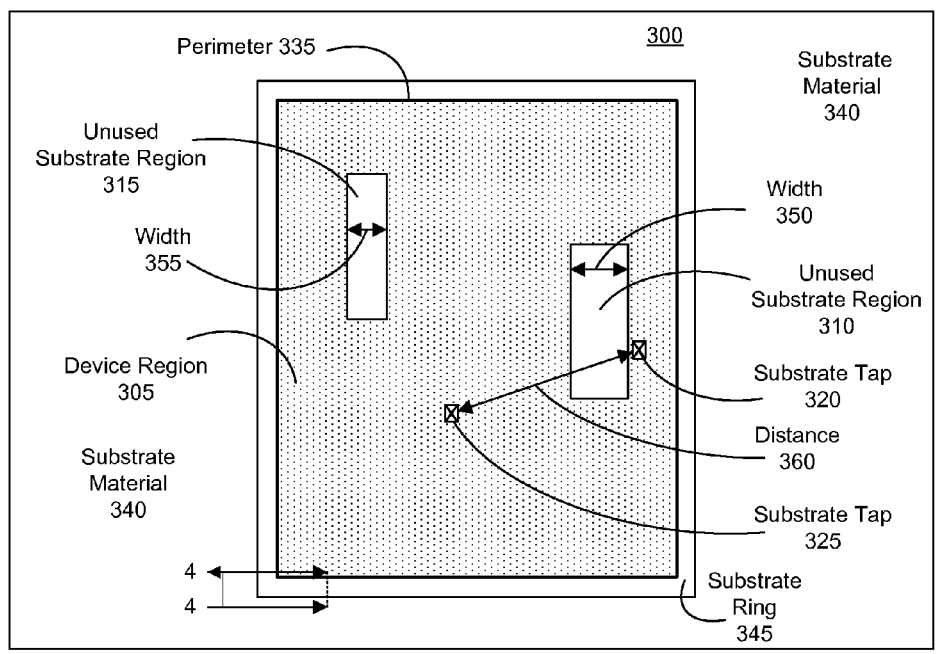
FIG. 3 is a topographic surface view of a layout cell.

Turning now to FIG. 3, a topographic surface view of a layout cell 300 is shown. Layout cell 300 illustrates a layout cell to be implemented within a layout hierarchy of an IC. Layout cell 300 illustrates a layout cell to be submitted to a system, such as a system described below in reference to FIG. 6, for evaluation of ESD protection. Layout cell 300 can include device region 305, unused substrate regions 310 and 315, and substrate taps 320 and 325.

Device region 305 can include regions of layout cell 300 that do not constitute unused substrate material. Depending upon the IC manufacturing process used to manufacture layout cell 300, device region 305 can include active devices, devices implemented with, or within, diffusion regions, diffusion or substrate regions coupled to known voltage potentials, dielectric isolation regions, or any other regions of layout cell 300 that do not constitute unused substrate. A variety of approaches can be used to differentiate device region 305 from unused substrate material.

In one or more embodiments, the system can determine device region 305 by merging geometric shapes within layout cell 300 associated with regions of process layers used to implement devices defined as used substrate. For example, all n-diffusion layer regions, i.e., regions of a process layer associated with building an active device, and substrate taps within layout cell 300 can be identified. The geometric shapes associated with the n-diffusion regions and the substrate taps can be merged into, or considered, a single geometric shape. The system can define the single geometric shape as device region 305.

Within layout cell 300, the area surrounding device region 305 is assumed to be unused substrate and is designated as substrate material 340. With device region 305 defined, the system can determine an outer perimeter of device region 305. In one or more embodiments, the system can define the interface between device region 305 and substrate material 340, i.e., perimeter 335, as the outer perimeter of device region 305. With perimeter 335 determined, substrate ring 345 can be disposed adjacent to, and surrounding, perimeter 335 to provide ESD protection to layout cell 300. Substrate ring 345 can include substrate taps, vias, and regions of interconnect material layers required to couple the substrate material 340 adjacent to perimeter 335 to a ground bus in the IC.

As layout cell 300 can be created without prior knowledge of the larger layout hierarchy within which layout cell 300 is to reside, and/or other layout cell(s) that can reside adjacent to layout cell 300 in the layout hierarchy, the system assumes the area surrounding device region 305 is unused substrate material. Disposing substrate ring 345 around device region 305 can assure that device region 305 is protected from ESD event damage caused by adjacent unused substrate material regions no matter where layout cell 300 resides within the layout hierarchy. For example, an IC that is ESD tested by exposing the IC to a charge device model (CDM) type of ESD event demonstrates a tendency to suffer active device, e.g., N-type field effect transistor (NFET), failures within active devices neighboring large regions of unused substrate represented by substrate material 340 in FIG. 3. When coupled to a ground bus within the IC, substrate ring 345 can isolate device region 305 from areas of substrate material 340 that reside adjacent to perimeter 335, thereby protecting device region 305 from a CDM type of ESD event.

Although substrate ring 345 can isolate device region 305 from substrate material 340, unused substrate regions may be present within device region 305. Unused substrate regions 310 and 315 represent two distinct finite regions of unused substrate material enclosed within device region 305. The system can identify each of unused substrate regions 310 and 315 as unused substrate material. The system can compare a size of each of unused substrate regions 310 and 315 to a size threshold. For example, the system can determine that width 350 of unused substrate region 310 exceeds the size threshold of the ESD requirements. Accordingly, layout cell 300 requires modification, e.g., a reduction in the size of unused substrate region 310, to achieve a desired level of ESD protection. Alternatively, the system can determine that width 355 of unused substrate region 315 is below the size threshold and that layout cell 400 requires no modification.

The size threshold can vary according to the ESD protection requirements for the IC in which layout cell 300 is implemented. In addition, the parameters that define size can vary according to the IC manufacturing process used to implement layout cell 300 and the ESD protection requirements for the IC. The size threshold can be measured in terms of a length, a width, and/or an area of an unused substrate region depending upon the ESD protection requirements for the IC and the IC manufacturing process with which the IC is to be implemented.

For example, since active devices can suffer failures when neighboring regions of unused substrate, active devices within device region 305 that neighbor unused substrate regions 310 and 315 can be damaged by a CDM type of ESD event of sufficient intensity. As the intensity of the CDM type of ESD event increases, the size of the region of unused substrate neighboring an active device required to damage the active device decreases. For this reason, as the level of ESD protection required for layout cell 300 increases, the value assigned to the size threshold decreases. Decreasing the size threshold decreases the maximum size of an unused substrate region allowed within device region 305. As the maximum size of an unused substrate region allowed within device region 305 decreases, the immunity of layout cell 300 to a CDM type of ESD event increases.

When either of unused substrate regions 310 and/or 315 exceeds the size threshold, layout cell 300 can be altered in a manner that reduces the size of each of unused substrate regions 310 and 315 so as not to exceed the size threshold. For example, one or more substrate taps can be disposed within unused substrate region 310 in order to reduce the amount of unused substrate contained within unused substrate region 310.

The system further can identify one or more substrate taps within perimeter 335. For example, the system can identify each of substrate taps 320 and 325. The system can calculate a maximum spacing between substrate taps within device region 305. For example, distance 360 can represent the spacing between substrate taps 320 and 325 within device region 305. The system can compare distance 360 to the spacing threshold specified by the ESD requirements. For example, the system can determine that distance 360 exceeds the spacing threshold and that layout cell 300 requires additional substrate taps to achieve the desired level of ESD protection. In that case, the system can dispose one or more additional substrate taps within perimeter 335 to reduce the space between substrate taps within device region 305 below the spacing threshold. It should be appreciated that while only two substrate taps are illustrated within device region 305, more than two can be included. For example, a grid of substrate taps can be included. Accordingly, the system can check the distance to the right, left, up, and down, from each substrate tap to the next adjacent substrate tap or the perimeter 335 in each respective direction. No substrate tap, for instance, should be separated from the next adjacent tap or perimeter 335 in any direction by more than a predetermined distance specified by the ESD requirements.

Figure 4:
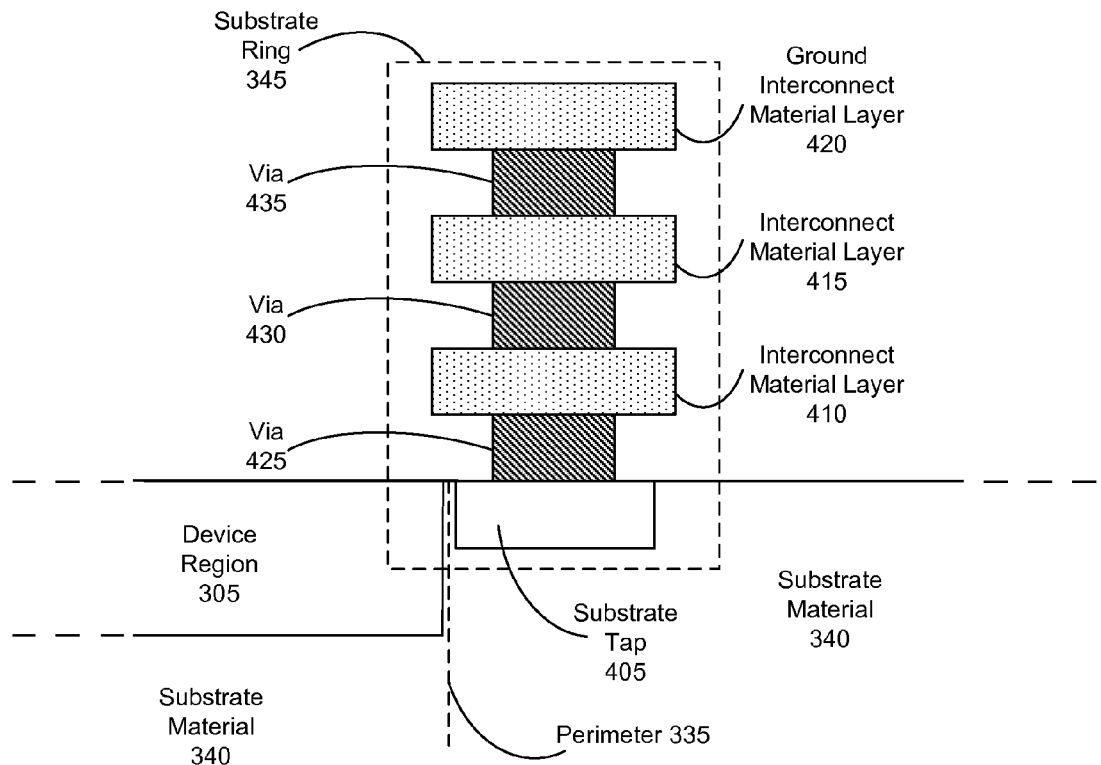
FIG. 4 is a cross-sectional side view of a portion of a layout cell of FIG. 3 taken at lines 4-4.

FIG. 4 is a cross-sectional side view of a portion of layout cell 300. FIG. 4 illustrates a cross-section of substrate ring 345 described with reference to FIG. 3 taken along cut-line 4-4. As such, like numbers will be used to refer to the same items throughout this specification. Substrate ring 345 can couple the substrate material adjacent to, and surrounding, layout cell 300 (not shown) to a ground bus in an IC within which layout cell 300 is to be implemented. Substrate ring 345 can include substrate tap 405, interconnect material layers 410, 415 and 420, and vias 425, 430, and 435.

Substrate tap 405 can be formed of a single tap or a plurality of taps disposed along an outer edge of perimeter 335. For example, substrate tap 405 can be formed as a single, ring or rectangular shaped tap encompassing the device region. Alternatively, substrate tap 405 can be formed of a plurality of taps in ring or rectangular shape encompassing the device region, where each tap is separated from each other tap forming substrate tap 405 by a predetermined distance that can be checked against the ESD requirements.

As used within this specification, "a tap" can refer to a physical IC structure that electrically couples an IC layer to a metal layer through which the IC layer can be coupled to other structures within the IC. Taps can include one or more IC process layers. Accordingly, substrate tap 405 can couple substrate material 340 to another conductive material, e.g., interconnect layer 410 through via 425, or a predetermined voltage potential.

The density of substrate taps used to implement substrate tap 405 can be determined by the level of ESD protection required. As the intensity of an ESD event increases, the greater the density of substrate taps required to divert ESD event generated currents away from device region 305. For example, larger densities can be achieved through smaller spacing between taps forming substrate tap 405. Providing a path to ground for currents generated by the ESD events assures that the voltage potential of substrate material 340 surrounding device region 305 remains approximately equal to ground. Although substrate taps are typically coupled to a ground potential within an IC, on occasion substrate taps can be coupled to alternative voltage potential available within the IC. As such, the coupling of substrate tap 405 to ground, as illustrated within this specification, is for descriptive purposes only and is not intended to limit the one or more embodiments disclosed herein.

Each of vias 425-435 couples substrate tap 405 or one of interconnect material layers 410-420 to an adjacent interconnect material layer of interconnect material layers 410-420. Vias 425-435 represent one or more via structures typically used within an IC manufacturing process to electrically couple different, i.e., vertically distinct, interconnect material layers within the IC. As the different interconnect material layer can be vertically isolated by an insulating layer such as, for example, field oxide, vias 425-435 can create a vertical conductive pathway through the insulating layer. Each of vias 425-435 can electrically couple any two of substrate tap 405, interconnect material layers 410, 415, and 420 that reside on adjacent process layers. Vias 425-435 each can be a single via or a plurality of vias, coupling two adjacent process layers.

Although illustrated as being vertically stacked and vertically aligned within FIG. 4, vias 425-435 can be vertically offset. The vertical stacking and alignment of vias 425-435 as illustrated within FIG. 4 is for purposes of description only and is not intended to limit the one or more embodiments described within this specification. In some cases, for example, IC manufacturing processes preclude the vertical stacking and/or alignment of vias in order to enhance manufacturing yields and improve IC reliability. In combination, substrate tap 405, interconnect material layers 410-420, and vias 425-435 create a continuous conductive pathway from substrate material 340 to the ground bus.

Referring to FIG. 3, ground interconnect material layer 420 can be coupled to the ground bus. Typically within an IC, the ground bus is routed or formed with a top-level interconnect material layer of the IC, i.e., the interconnect material layer farthest from substrate material 340. The top interconnect material layer is typically the thickest interconnect material layer having the lowest sheet resistance value. As such, when seeking to reduce ground bus resistance, the top interconnect material layer can be superior to other interconnect material layers for routing the ground bus. Within FIG. 4, ground interconnect material layer 420 represents the top-level interconnect material layer and/or the interconnect material layer within which the ground bus of the IC is implemented.

Substrate ring 345 can be implemented to couple together each interconnect material layer residing between substrate tap 405 and interconnect material layer 420. Although implemented with three interconnect material layers within FIG. 3, substrate ring 345 can be implemented with different numbers of interconnect material layers. The number of interconnect material layers used to implement substrate ring 345 depends upon the number of interconnect material layers within an IC manufacturing process residing between the IC substrate and the interconnect material layer within which the ground bus of the IC is implemented. For example, some modern IC manufacturing processes can be implemented with ten or more distinct interconnect material layers. In that case, ten or more interconnect material layers can be coupled together with vias to implement substrate ring 345.

The density of vias to be disposed within substrate ring 345 can be determined by the level of ESD protection required. Additionally, the size, e.g., width, and number of interconnect material layers to be disposed within substrate ring 345 can be determined by the level of ESD protection required.

Typically, during a mask design process for an IC, layout cells are coupled together within a hierarchical layout architecture. At the top level of the layout hierarchy, IC wide signals, e.g., clock signals and power supply buses, are routed across the IC and coupled to layout cells comprising the top level of the layout hierarchy. Each top-level layout cell can include two or more mid-level layout cells coupled together with regions of interconnect material. Each mid-level layout cell can include two or more lower-level layout cells, etc., until a bottom level of the layout hierarchy is reached. During the mask design process, the location of a layout cell within the hierarchical architecture may not be determined. For this reason, the type of interconnect material that overlays the layout cell may not be known at the time the layout cell is created prior to coupling the layout cell to the ground bus at the top level of the layout hierarchy.

For example, layout cell 300 can be in a lower level of an IC layout hierarchy. As substrate tap 405 is coupled to substrate material 340, substrate tap 405 resides below the lowest interconnect material layer, e.g., interconnect material layer 410, available within the IC. As such, regions of each of interconnect material layer 410-420 must be coupled together with vias to couple substrate tap 405 to the ground bus. During the mask design process, various regions of interconnect material 410-420 can be routed over layout cell 300 to couple signals shared with, or between, neighboring layout cells. When the routing of the ground bus to substrate tap 405 is withheld until interconnect material layer 420 of the top-level layout hierarchy is routed, the presence of the regions of interconnect material overlying layout cell 300 can obstruct the routing of regions of interconnect material 410-420 and the placement of vias to couple substrate tap 405 to the ground bus.

Even when a conductive pathway can be routed from substrate tap 505 to the ground bus, the robustness of the conductive path created from substrate tap 405 to the ground bus may not be sufficient to handle the level of ESD protection specified for the IC. As such, the density of vias and size of the regions of interconnect material disposed within substrate ring 345 must implement a conductive pathway that is sufficient to meet the level of ESD protection specified for the IC within which substrate ring 345 is implemented. While FIGS. 3 and 4 are shown by way of example as one arrangement of a circuit having substrate taps, it should be understood that substrate taps could be used with specific circuit elements, such as a memory block for example, or any element of a circuit. FIGS. 3 and 4 are provided to show one application of a substrate tap and a ground path to the substrate tap. However, the various circuits and methods described below could be implemented in any circuit requiring that a substrate tap provide a path having a minimum resistance.

Figure 5:
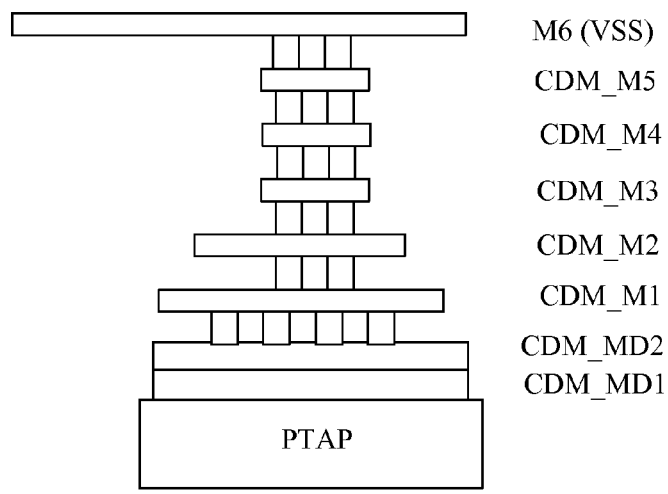
FIG. 5 is a cross-sectional view showing a ground path coupled to a substrate tap in an integrated circuit.

Turning now to FIG. 5, a cross-sectional view shows a ground path coupled to a substrate tap in an integrated circuit. The ground path may be implemented as a part of a CDM circuit, where FIG. 5 provides a solution for CDM enhancement by requiring low resistance routing. ESD protection schemes are implemented to protect devices internal to the IC that can be vulnerable to ESD events. Devices considered vulnerable typically are devices that output to, or come in contact with, external nodes of the IC. For this reason, ESD protection schemes typically attempt to steer current around output devices, effectively bypassing the ESD sensitive output devices of the IC. As set forth above, however, active devices internal to an IC, i.e., non-output devices, that neighbor unused substrate regions also can fail when the IC is subjected to a CDM type of ESD event. The failure of an active device due to a CDM type of ESD event can render the IC inoperable, thereby reducing manufacturing yields and increasing manufacturing costs for the IC.

In particular, a CDM protection scheme relies on collecting the charges from the substrate and discharging them to ground. A verification solution is offered by adding a CAD layer, i.e., "cdm_metal," from the substrate tap to the ground mesh. The ground mesh according to the arrangement of FIG. 5 is metal layer M6. While elements above metal layer M6 could be designated as CDM metal layers, there is no need to place "cdm_metal" layers beyond the metal layer M6 because that part of the routing has low resistive. That is, traces in metal layers above metal layer M6 are generally lower resistance, and therefore are not a significant part of the resistance in the path between the substrate tap and a ground contact (e.g., a solder ball 124 on the integrated circuit device). Adding the "cdm_metal" designation to metal layer elements of the circuit design enables an RC extraction tool to extract a strapping resistance value for that specific path associated with a CDM circuit, and provides feedback to the designers to enable meeting the design rule requirement.

Substrate taps are implemented as described above. If a cell width (W) is greater than 5 micrometers (p), a tap is placed every 5µ to accommodate 3 vias. The substrate tap is strapped completely with a first metal layer, (i.e., where the two metal layers CDM_MD1 and CDM_MD2 are completely within the substrate tap). The substrate tap is then completely strapped with a portion CDM_M1 of metal layer M1. CDM_M1 is strapped with CDM_M2 where CDM_M2 covers 70% of CDM_M1 to provide room for other routing circuits within the device. CDM_M2 is strapped with CDM_M3, where CDM_M3 covers 70% of CDM_M2. CDM_M3 is strapped with CDM_M4, where CMD M4 covers 100% of CDM_M3. The intermediate metal layers are strapped as shown between CDM_M3 and CDM_M4 and between CDM_M4 and CDM_M5 until the GND mesh metal layer, shown here as metal layer M6 for VSS, is reached. While the decrease in the size of elements of the CDM layers reduces the area occupied by the CDM ground path (assuming that the resistance of the CDM path meets the minimum resistance), it should be understood that the CDM metal layers could have the same size extending to the metal layer M6. While each of the CDM metal layers as shown completely overlaps a CDM metal layer below it, it should be understood that the metal layers could be offset, provided that the layers have some overlap. Accordingly, in addition to meeting a resistance requirement, rules could be established regarding the placement of the CDM metal layers to help insure that the ground path from the substrate tap meets a resistance requirement. For example, by requiring that each CDM metal layer is completely within a CDM metal layer below it, the CDM path from the substrate tap to the metal layer will be vertical and therefore have a lower resistance than a path which could extend horizontally at locations outside of the substrate tap.

The lower resistance on this path ensures low IR drop along the discharge path and offers better CDM immunity to integrated circuit devices. The arrangement of FIG. 5 lowers strapping resistance of a discharge path from a substrate tap to a ground contact of an integrated circuit device. The configuration of metal layers and vias enables low resistance routing from the substrate tap to the ground mesh, where cdm_metal routing rules can be enforced by extraction and re-routing of the path for metal layer portions designated as a part of a CDM path for a given substrate tap. That is, after a value of a resistance is determined, the design may be re-routed to ensure that the ground path meets a minimum desired resistance (e.g., is less than, or less than or equal to, the desired resistance). The elements of the ground path can be designated as CDM elements so that they can easily be extracted to determine the resistance of the ground paths. A commercially available RC extraction tool, such as the Star-RCXT extraction tool commonly available from Synopsis, Inc., may be used to extract the routing resistance from the substrate tap to the ground mesh. Because a resistance from the ground mesh to the ground pin (metal layers above the metal layer M6) is low resistance by design, elements of the ground path above the ground mesh can therefore be ignored for verification purpose. Alternatively, those metal elements can be included in the resistance calculation. That is, while it is indicated that a resistance value between the substrate tap and the metal layer M6 is compared to a predetermined minimum CDM resistance, a resistance associated with the entire path between the substrate tap and a contact of the integrated circuit could be compared to a minimum CDM resistance.

Figure 6:
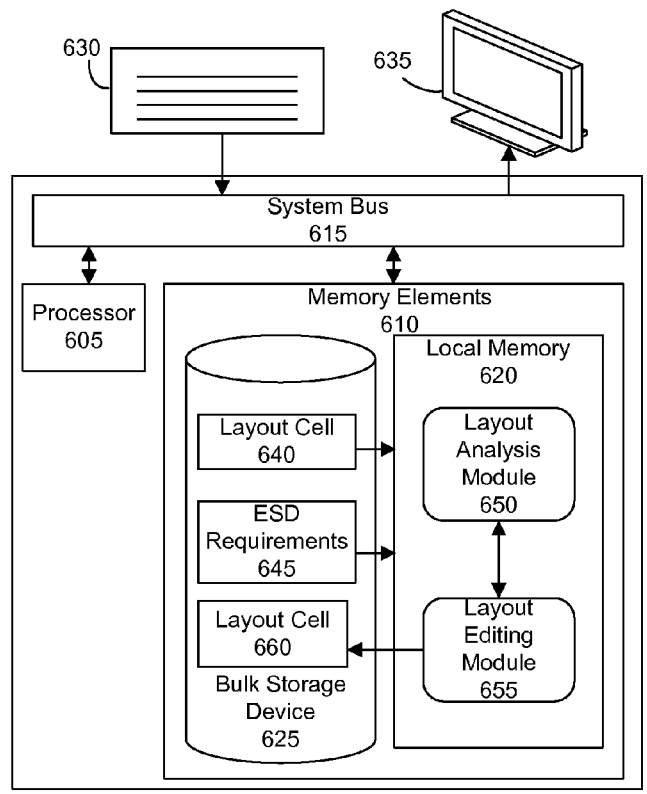
FIG. 6 is a block diagram illustrating a system for cell-level electrostatic discharge evaluation and protection for use in designing an integrated circuit.

FIG. 6 is a block diagram illustrating a system for cell-level ESD evaluation and protection for use in designing an IC. In one aspect, system 600 can generate an ESD protected layout cell for instantiation within the IC.

As pictured in FIG. 6, system 600 can include at least one processor 105 coupled to memory elements 610 through a system bus 615. As such, system 600 can store program code within memory elements 610. Processor 605 can execute the program code accessed from memory elements 610 via system bus 615. In one aspect, for example, system 600 can be implemented as a computer that is suitable for storing and/or executing program code. It should be appreciated, however, that system 600 can be implemented in the form of any system comprising a processor and memory that is capable of performing the functions described within this specification.

Memory elements 610 can include one or more physical memory devices such as, for example, local memory 620 and one or more bulk storage devices 625. Local memory 620 refers to random access memory or other non-persistent memory device(s) generally used during actual execution of the program code. Bulk storage device(s) 625 can be implemented as a hard drive or other persistent data storage device. System 600 also can include one or more cache memories (not shown) that provide temporary storage of at least some program code in order to reduce the number of times program code must be retrieved from bulk storage device 625 during execution.

Input/output (I/O) devices such as a keyboard 630, a display 635, and a pointing device (not shown) optionally can be coupled to system 600. The I/O devices can be coupled to system 600 either directly or through intervening I/O controllers. Network adapters also can be coupled to system 600 to enable system 600 to become coupled to other systems, computer systems, remote printers, and/or remote storage devices through intervening private or public networks. Modems, cable modems, and Ethernet cards are examples of different types of network adapters that can be used with system 600.

Memory elements 610 can store layout analysis module 650 and layout editing module 655. Layout analysis module 650 and layout editing module 655, being implemented in the form of executable program code, can be executed by system 600. Layout analysis module 650 can receive a layout cell 640 and one or more ESD requirements (hereafter "ESD requirements") 645. Layout cell 640 can programmatically describe the various process layers of an IC manufacturing process used to implement a circuit block within an IC. For example, layout cell 640 can include various parameters that specify physical dimensions of each of the one or more process layers used to form the circuit block.

As used within this specification, a "layout" or "IC layout," can refer to a representation of an IC in terms of planar geometric shapes that correspond to the design masks that pattern the metal layers, the oxide regions, the diffusion areas, and/or other process layers that make up devices of the IC. A "cell" or "layout cell" can refer to a segment or section of an IC layout that can be considered a discrete unit and, as such, represents a distinct layout region to be designed and verified using the physical design and verification computer aided design (CAD) tools of an IC manufacturing process, e.g., system 600. A cell or layout cell typically defines or specifies a circuit block having a defined or particular function.

Layout analysis module 650 can determine whether various features of layout cell 640 meet ESD requirements 645. For example, layout analysis module 650 can determine an outer perimeter of layout cell 640. Layout analysis module 650 can determine whether a substrate ring surrounds the outer perimeter of layout cell 640 and whether the substrate ring complies with ESD requirements 645. Layout analysis module 650 further can output an indication of whether the substrate ring exists and meets ESD requirements 645.

In another example, layout analysis module 650 can identify unused regions of substrate that reside within layout cell 640 and calculate the size of the unused substrate regions. Layout analysis module 650 can determine whether the size of the unused substrate regions exceeds a size threshold specified by ESD requirements 645. Layout analysis module 650 can output an indication of whether one or more identified and unused substrate regions within layout cell 640 exceed the size threshold.

In yet another example, layout analysis module 650 can identify each substrate tap within the outer perimeter of layout cell 640. Layout analysis module 650 can determine spacing between different ones, e.g., pairs, of substrate taps. Layout analysis module 650 can determine whether the spacing between substrate taps exceeds a spacing threshold specified by ESD requirements 645 and output an indication of whether the spacing between identified substrate taps exceeds the spacing threshold.

Layout editing module 655 can receive layout cell 640 and ESD requirements 645. Through layout editing module 655, a user or a system, e.g., system 600, can alter one or more features of layout cell 640 that are indicated by layout analysis module 650 to be deficient in meeting ESD requirements 645. For example, layout editing module 655 can add substrate taps, add one or more vias, add one or more regions of interconnect material, alter the size of unused substrate regions, alter the spacing between substrate taps, or the like to layout cell 640. Layout editing module 655 can output an altered version of layout cell 640 as layout cell 660. As used herein, "outputting" and/or "output" can mean storing in memory elements 610, for example, writing to a file stored in memory elements 610, writing to display 635 or other peripheral output device, sending or transmitting to another system, exporting, or the like.

In operation, layout analysis module 650 can receive layout cell 640 and ESD requirements 645. ESD requirements 645 can specify various layout design and verification parameters that, when applied to layout cell 640, assure that an IC in which layout cell 640 is implemented can withstand an ESD event of a predetermined intensity. Layout analysis module 650 can identify the various geometric shapes, associated with IC manufacturing process layers within layout cell 640. Analyzing the various geometric shapes and/or structures, layout analysis module 650 can determine an outer perimeter of layout cell 640. As each IC manufacturing process can contain differing process layers, the manner in which layout analysis module 650 determines the perimeter of layout cell 640 can vary according to the IC manufacturing process being used to implement the IC within which layout cell 640 is to be implemented. In addition, feature size and spacing requirements of the IC manufacturing process can influence the determination of the outer perimeter of layout cell 640 by layout analysis module 650.

Having determined the outer perimeter of layout cell 640, layout analysis module 650 can determine whether a substrate ring surrounds the outer perimeter of layout cell 640. Additionally, layout analysis module 650 can determine whether the substrate ring is sufficiently robust to provide a level of ESD protection as required by ESD requirements 645. For example, layout analysis module 650 can determine whether a number of substrate taps and a size of each substrate tap encompassing the outer perimeter of layout cell 640 conforms with ESD requirements 645. The ring of substrate taps, for example, can be adjacent to, and surround, the outer perimeter of layout cell 640. In addition, layout analysis module 650 can identify regions of one or more interconnect material layers within the substrate ring that couple the substrate taps of layout cell 640 to a ground bus within the IC in which layout 640 is to be implemented. Accordingly, layout analysis module 650 can determine whether a number of the regions and a size of each region of the interconnect material layer(s) are sufficiently robust to provide the level of ESD protection as required by ESD requirements 645, e.g., conform with ESD requirements 645. Typically, the ground bus is accessible at the top level of a layout hierarchy for the IC.

For example, to determine whether the substrate ring is sufficiently robust, layout analysis module 650 can determine whether a number and a size of at least one via used within the substrate ring to couple adjacent interconnect material layers is sufficiently robust to withstand the voltage potentials and currents generated during the occurrence of an ESD event of a predetermined intensity. When layout analysis module 650 determines that any feature of the substrate ring is deficient in providing the level of ESD protection required by ESD requirements 645, layout analysis module 650 can output an indication identifying the feature that is deficient.

Subsequent to identifying the feature, layout analysis module 650 can provide layout cell 640 to layout editing module 655. Through layout editing module 655, layout cell 640 can be altered to overcome the deficient features of the substrate ring identified by layout analysis module 650. In one or more embodiments, layout editing module 655 can include a user interface though which a user can perform edits altering layout cell 640. The user edits can alter features of layout cell 640 in a manner that overcomes each deficiency identified by layout analysis module 650.

In one or more other embodiments, layout editing module 655 can receive layout cell 640, ESD requirement data 645, the indication(s) of deficient features from layout analysis module 650, and automatically alter layout cell 640 in a manner that overcomes the identified and deficient features. For example, layout analysis module 650 can determine if layout cell 640 lacks a substrate ring. Using the outer perimeter determined by layout analysis module 650 for layout cell 640, layout editing module 655 can automatically add a substrate ring adjacent to, and surrounding, the outer perimeter of layout cell 640. The dimensions and characteristics of the substrate ring created by layout editing module 655 can be determined from ESD requirements 645. Subsequent to editing layout cell 640, layout editing module 650 can return layout cell 640 to layout analysis module 650 for further analysis.

Continuing, layout analysis module 650 can identify each region of unused substrate within the outer perimeter of layout cell 640. As described, variations in IC manufacturing processes such as process layer types, feature sizes, feature spacing, and the like, can affect the characteristics, size, and shape of regions identified by layout analysis module 650 as unused substrate. In one or more embodiments, layout analysis module 650 can determine that any region, within the outer perimeter of layout cell 640, containing no regions of n-diffusion layer and no substrate taps is an unused substrate region.

For each unused substrate region identified, layout analysis module 650 can determine whether the size of the unused substrate region exceeds a size threshold specified by ESD requirements 645. Using the size threshold, layout analysis module 650 can assure that no unused substrate region exists within layout cell 640 that exceeds the size threshold. The value of the size threshold specified by ESD requirements 645 can vary depending upon the level of ESD protection desired for the IC within which layout cell 640 is to be implemented.

When layout analysis module 650 determines that the size of one or more unused substrate regions exceeds the size threshold, layout analysis module 650 can output an indication that the one or more unused substrate regions exceeds the size threshold. Subsequent to generating the indication, layout analysis module 650 can pass layout cell 640 to layout editing module 655. Layout editing module 655, either under manual control or automatically, can alter layout cell 640 to reduce the size of each identified and unused substrate region that exceeds the size threshold.

Continuing, layout analysis module 650 can identify each substrate tap within the outer perimeter of layout cell 640. Layout analysis module 650 can determine the space or distance between pairs of substrate taps. Layout analysis module 650 can determine whether the space between the substrate taps exceeds the spacing threshold specified by the ESD requirements 645. Using the spacing threshold, layout analysis module 650 can assure that no unused substrate region exists within layout cell 640 that is not coupled, via a substrate tap, to a ground potential. The value of the spacing threshold specified within ESD requirements 645 can vary depending upon the level of ESD protection desired for the IC within which layout cell 640 is to be implemented.

When layout analysis module 650 determines that the space between one or more pairs of substrate taps exceeds the spacing threshold, layout analysis module 650 can output an indication that the maximum space between the substrate taps exceeds the spacing threshold. Subsequent to generating the indication, layout analysis module 650 can provide layout cell 640 to layout editing module 655. Through layout editing module 655, layout cell 640 can be altered in a manner that reduces the spacing between pairs of substrate taps to be less than or equal to the spacing threshold. For example, additional substrate taps can be added or existing substrate taps can be relocated.

Subsequent to layout cell 640 being altered to correct each deficiency identified by layout analysis module 650, the altered version of layout cell 640 can be stored within bulk memory device 625 as layout cell 660. Layout cell 660 can represent a layout cell design sufficiently robust to withstand an ESD event of a predetermined intensity associated with ESD requirements 645.

Figure 7:
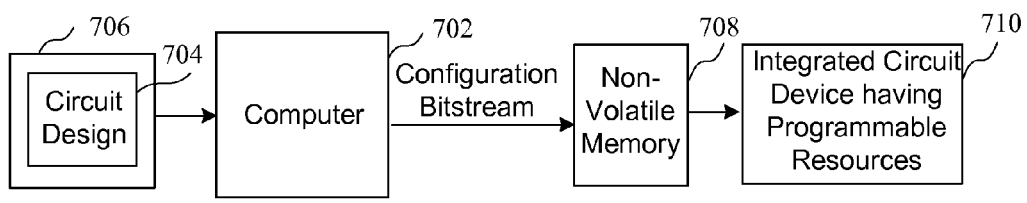
FIG. 7 is a block diagram of a system for programming a device having programmable resources.

Turning now to FIG. 7, a block diagram of a system for programming a device having programmable resources according to an embodiment is shown. In particular, a computer 702 is coupled to receive a circuit design 704 from a memory 706, and generate a configuration bitstream which is stored in the non-volatile memory 706. As will be described in more detail below, the circuit design may be a high level design, such as a circuit design defined in a hardware description language (HDL). Also, the computer may be configured to run software that generates a configuration bitstream which is stored in the non-volatile memory 708 and provided to an integrated circuit 710 which may be a programmable integrated circuit, such as the integrated circuit described below in FIG. 8.

The software flow for a circuit design to be implemented in a programmable integrated circuit comprises synthesis, packing, placement and routing, as is well known in the art. Synthesis comprises the step of converting a circuit design in a high level design to a configuration of elements found in the programmable integrated circuit. For example, a synthesis tool operated by the computer 802 may implement the portions of a circuit design implementing certain functions in configurable logic blocks (CLBs) or digital signal processing (DSP) blocks, for example. An example of a synthesis tool is the ISE tool available from Xilinx, Inc. of San Jose Calif. Packing comprises the step of grouping portions of the circuit design into defined blocks of the device, such as CLBs. Placing comprises the step of determining the location of the blocks of the device defined during the packing step. Finally, routing comprises selecting paths of interconnect elements, such as programmable interconnects, in a programmable integrated circuit. At the end of place and route, all functions, positions and connections are known, and a configuration bitstream is then created. The bitstream may be created by a software module called BitGen, available from Xilinx, Inc. of San Jose, Calif. The bitstream is either downloaded by way of a cable or programmed into an EPROM for delivery to the programmable integrated circuit.

Figure 8:
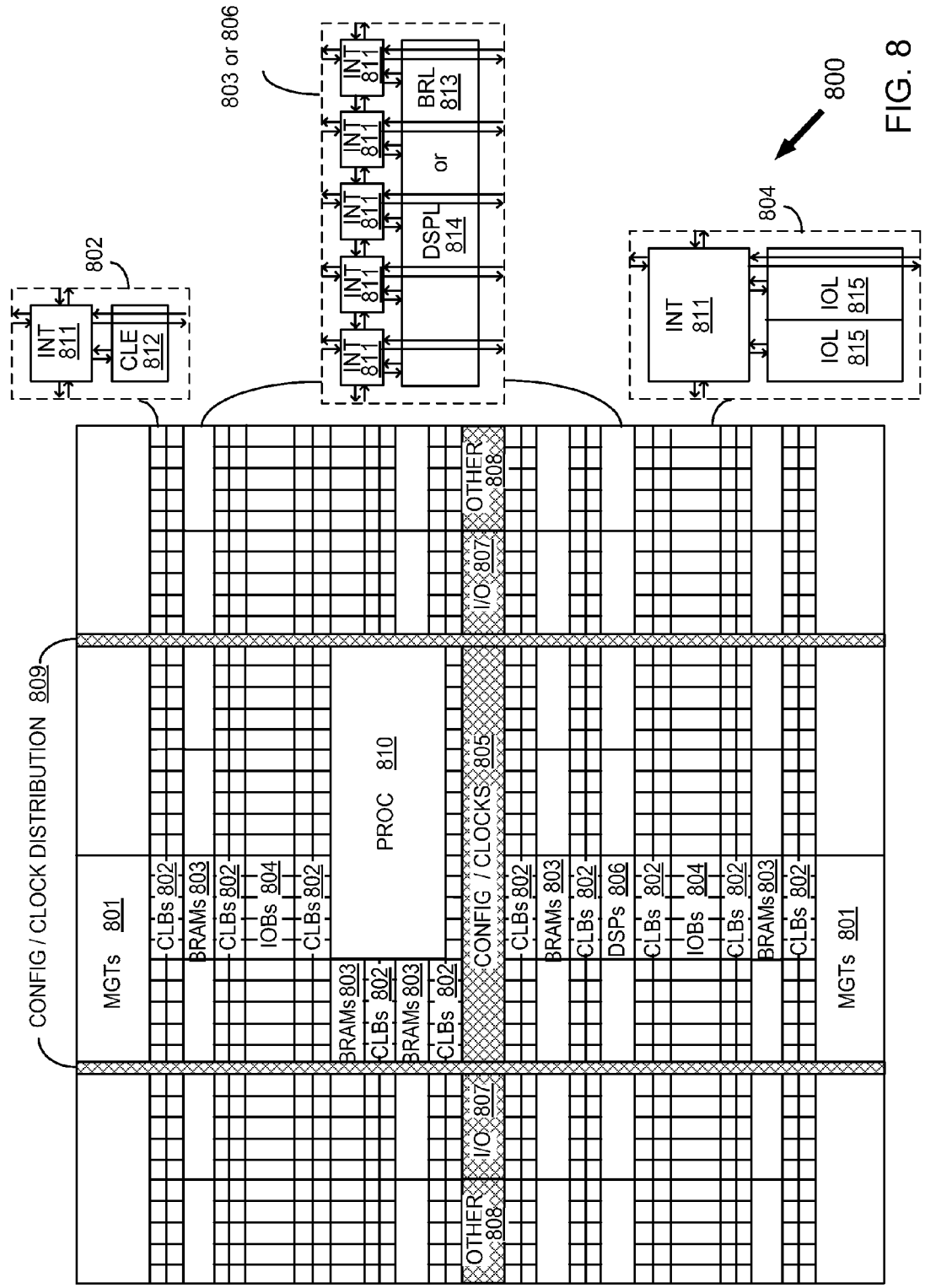
FIG. 8 is a block diagram of a device having programmable resources.

Turning now to FIG. 8, a block diagram of a device having programmable resources, including memory elements as described above, is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 8 comprises an FPGA architecture 800 having a large number of different programmable tiles including multi-gigabit transceivers (MGTs) 801, CLBs 802, random access memory blocks (BRAMs) 803, input/output blocks (IOBs) 804, configuration and clocking logic (CONFIG/CLOCKS) 805, digital signal processing blocks (DSPs) 806, specialized input/output blocks (I/O) 807 (e.g., configuration ports and clock ports), and other programmable logic 808 such as digital clock managers, analog-to-digital converters, system monitoring logic, and so forth. Some FPGAs also include dedicated processor blocks (PROC) 810, which may be used to implement a software application, for example.

In some FPGAs, each programmable tile includes a programmable interconnect element (INT) 811 having standardized connections to and from a corresponding interconnect element in each adjacent tile. Therefore, the programmable interconnect elements taken together implement the programmable interconnect structure for the illustrated FPGA. The programmable interconnect element 811 also includes the connections to and from the programmable logic element within the same tile, as shown by the examples included at the top of FIG. 8.

For example, a CLB 802 may include a configurable logic element (CLE) 812 that may be programmed to implement user logic plus a single programmable interconnect element 811. A BRAM 803 may include a BRAM logic element (BRL) 813 in addition to one or more programmable interconnect elements. The BRAM includes dedicated memory separate from the distributed RAM of a configuration logic block. Typically, the number of interconnect elements included in a tile depends on the height of the tile. In the pictured embodiment, a BRAM tile has the same height as five CLBs, but other numbers may also be used. A DSP tile 806 may include a DSP logic element (DSPL) 814 in addition to an appropriate number of programmable interconnect elements. An IOB 804 may include, for example, two instances of an input/output logic element (IOL) 815 in addition to one instance of the programmable interconnect element 811. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die is used for configuration, clock, and other control logic. The config/clock distribution regions 809 extending from this column are used to distribute the clocks and configuration signals across the breadth of the FPGA. Some FPGAs utilizing the architecture illustrated in FIG. 8 include additional logic blocks that disrupt the regular columnar structure making up a large part of the FPGA. The additional logic blocks may be programmable blocks and/or dedicated logic. For example, the processor block PROC 810 shown in FIG. 8 spans several columns of CLBs and BRAMs.

Note that FIG. 8 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 8 are purely exemplary. For example, in an actual FPGA more than one adjacent column of CLBs is typically included wherever the CLBs appear in order to facilitate the efficient implementation of user logic. While the embodiment of FIG. 8 relates to an integrated circuit having programmable resources, it should be understood that the circuits and methods set forth in more detail below could be implemented in any type of ASIC.

Figure 9:
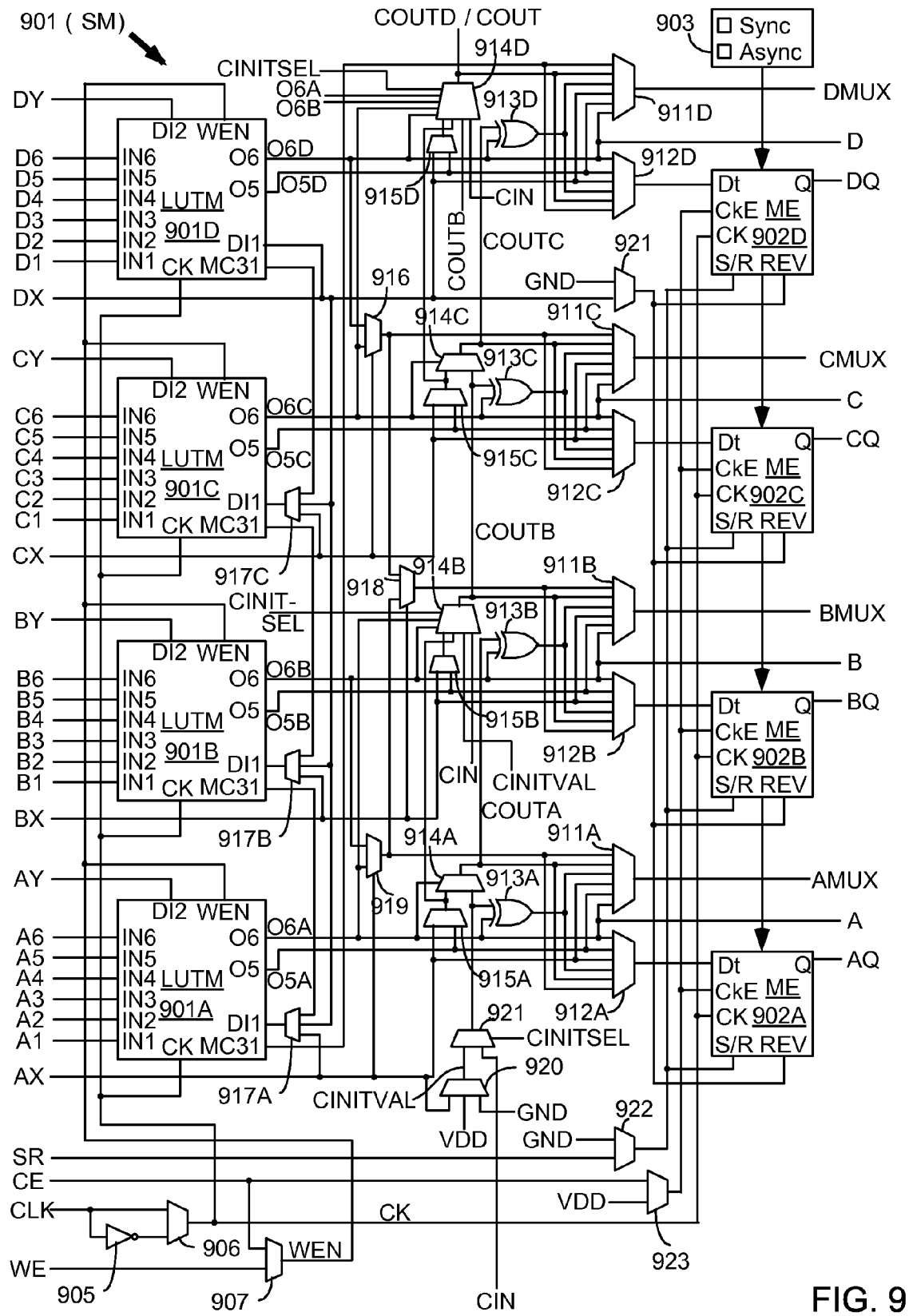
FIG. 9 is block diagram of a configurable logic element of the device of FIG. 8.

Turning now to FIG. 9, a block diagram of a configurable logic element of the device of FIG. 8 according to an embodiment is shown. In particular, FIG. 9 illustrates in simplified form a configurable logic element of a configuration logic block 802 of FIG. 8. In the embodiment of FIG. 9, slice M 901 includes four lookup tables (LUTMs) 901A-901D, each driven by six LUT data input terminals A1-A6, B1-B6, C1-C6, and D1-D6 and each providing two LUT output signals O5 and O6. The O6 output terminals from LUTs 901A-901D drive slice output terminals A-D, respectively. The LUT data input signals are supplied by the FPGA interconnect structure via input multiplexers, which may be implemented by programmable interconnect element 911, and the LUT output signals are also supplied to the interconnect structure. Slice M also includes: output select multiplexers 911A-911D driving output terminals AMUX-DMUX; multiplexers 912A-912D driving the data input terminals of memory elements 902A-902D; combinational multiplexers 916, 918, and 919; bounce multiplexer circuits 922-923; a circuit represented by inverter 905 and multiplexer 906 (which together provide an optional inversion on the input clock path); and carry logic having multiplexers 914A-914D, 915A-915D, 920-921 and exclusive OR gates 913A-913D. All of these elements are coupled together as shown in FIG. 9. Where select inputs are not shown for the multiplexers illustrated in FIG. 9, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 9 for clarity, as well as from other selected figures herein.

In the pictured embodiment, each memory element 902A-902D may be programmed to function as a synchronous or asynchronous flip-flop or latch. The selection between synchronous and asynchronous functionality is made for all four memory elements in a slice by programming Sync/Asynch selection circuit 903. When a memory element is programmed so that the S/R (set/reset) input signal provides a set function, the REV input terminal provides the reset function. When the memory element is programmed so that the S/R input signal provides a reset function, the REV input terminal provides the set function. Memory elements 902A-902D are clocked by a clock signal CK, which may be provided by a global clock network or by the interconnect structure, for example. Such programmable memory elements are well known in the art of FPGA design. Each memory element 902A-902D provides a registered output signal AQ-DQ to the interconnect structure. Because each LUT 901A-901D provides two output signals, O5 and O6, the LUT may be configured to function as two 5-input LUTs with five shared input signals (IN1-IN5), or as one 6-input LUT having input signals IN1-IN6.

In the embodiment of FIG. 9, each LUTM 901A-901D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 917A-917C for LUTs 901A-901C), or to the two 32-bit RAMs via input terminals DI1 and DI2. RAM write operations in the LUT RAMs are controlled by clock signal CK from multiplexer 906 and by write enable signal WEN from multiplexer 907, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 901A may also be provided to the general interconnect structure for shift register chaining, via output select multiplexer 911D and CLE output terminal DMUX. Accordingly, the circuits and methods set forth above may be implemented in a device such as the devices of FIGS. 8 and 9, or any other suitable device.

Figure 10:
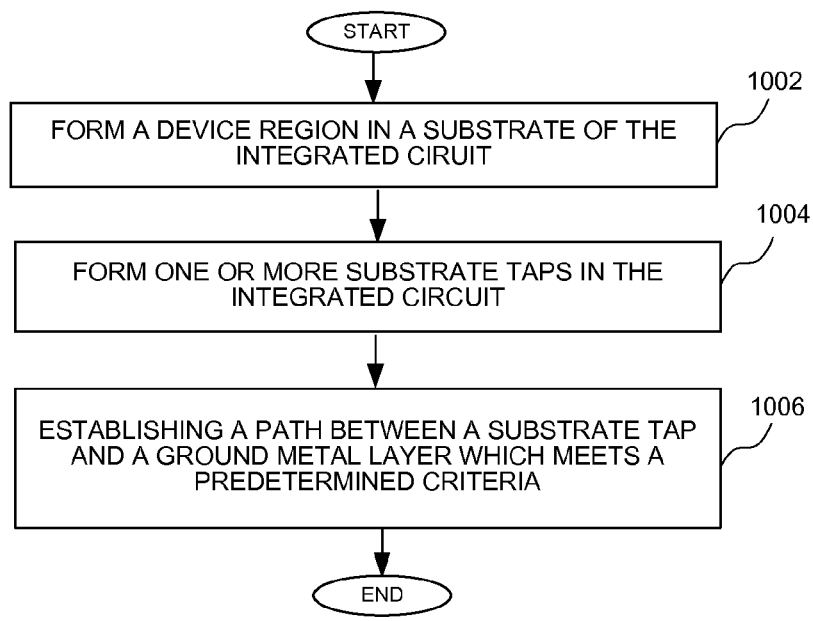
FIG. 10 is a flow chart showing a method of implementing an integrated circuit.

Turning now to FIG. 10, a flow chart shows a method of implementing an integrated circuit. In particular, device regions are formed in the substrate of an integrated circuit at a block 1002. One or more substrate taps are formed in the substrate of the integrated circuit at a block 1004. A path is established between the Substrate taps and a ground metal layer which meets predetermined criteria at a block 106. The path mat be established during a placement process using placement rules as set forth above, and may be re-routed to meet the placement rules.

Figure 11:
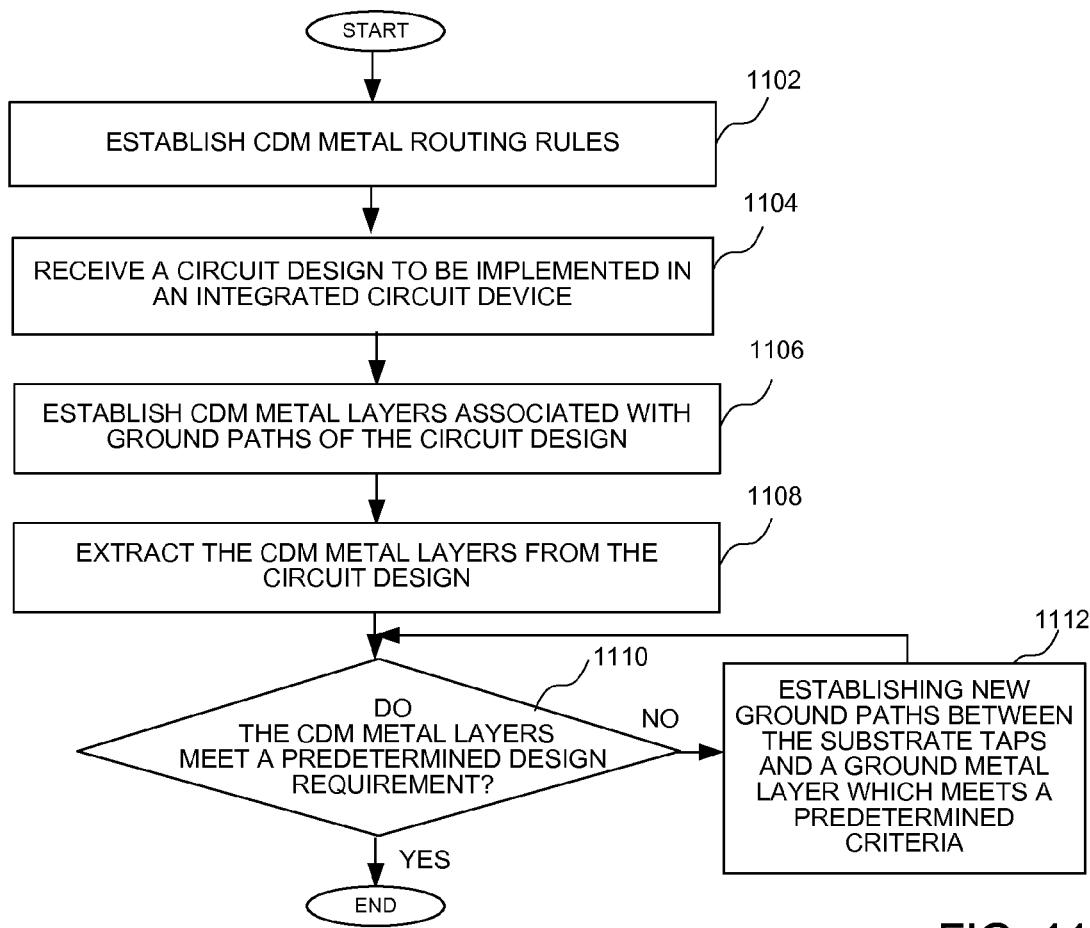
FIG. 11 is a flow chart showing a method of generating a device having a ground path.

Turning now to FIG. 11, a flow chart shows a method of generating a device having programmable resources. In particular, CDM metal routing rules are established at a block 1102. A circuit design to be implemented in an integrated circuit is received at a block 1104. A CDM layer associated with the circuit design is established at a block 1106. The CDM layers are extracted from the circuit design at a block 1108. It is then determined at a block 1110 whether the CMD metal layers associated with CDM ground paths meet a predetermined design requirement. If not, new ground paths are established at a block 1112 between corresponding substrate taps and a ground metal layer which meets predetermined criteria, which may include being below a predetermined resistance for example.

The methods of FIGS. 10 and 11 may be implemented using any of the embodiments of FIGS. 1-9 as described and particularly the system of FIG. 6, or any other suitable circuits. While specific elements of the methods are described, it should be understood that additional elements of the method, or additional details related to the elements, could be implemented according to the disclosure of FIGS. 1-9.

It can therefore be appreciated that new circuits and methods for providing a ground path in an integrated circuit have been described. It will be appreciated by those skilled in the art that numerous alternatives and equivalents will be seen to exist which incorporate the disclosed invention. As a result, the invention is not to be limited by the foregoing embodiments, but only by the following claims.

What is claimed is:

1. A circuit for providing a ground path in an integrated circuit device, the circuit comprising:
 a device region formed in the substrate;
 a substrate tap formed adjacent to the device region; and
 a conductive path coupled between the substrate tap and a ground metal layer by way of a plurality of metal layers and vias, the conductive path comprising traces in metal layers associated with a CAD layer providing an electrostatic discharge protection circuit,
 wherein the association of the traces in metal layers with the CAD layer providing an electrostatic discharge protection circuit enables the conductive path to be re-routed to meet a resistance value that is below a predetermined resistance value.

2. The circuit of claim 1, wherein the resistance value of the conductive path is a resistance value associated with metal layers between the substrate and the ground metal layer of the integrated circuit device.

3. The circuit of claim 2, wherein a re-routed conductive path is provided between the substrate tap and the ground metal layer if the resistance value of the conductive path is not below the predetermined resistance value.

4. The circuit of claim 1, wherein the conductive path between the substrate tap and a ground metal layer comprises a conductive path between the substrate tap and a VSS ground plane.

5. The circuit of claim 1, wherein the conductive path comprises a CDM path.

6. A method of providing a ground path in an integrated circuit device, the method comprising:
 forming a device region in a substrate of the integrated circuit device;
 forming a substrate tap adjacent to the device region in the integrated circuit device;
 associating traces in metal layers of a conductive path with a CAD layer providing an electrostatic discharge protection circuit;
 providing the conductive path between the substrate tap and a ground metal layer by way of the traces in metal layers and vias of the integrated circuit device, and
 re-routing the conductive path between the substrate tap and the ground metal layer if a resistance value of the conductive path is not below a minimum resistance value, wherein the re-routed conductive path has a resistance value that is below the minimum resistance value.

7. The method of claim 6, further comprising extracting the resistance value associated with the conductive path.

8. The method of claim 7, wherein extracting the resistance value comprises determining a resistance value associated with the traces in metal layers between the substrate and the ground metal layer.

9. The method of claim 6, wherein providing the conductive path between the substrate tap and a ground metal layer comprises providing the conductive path between the substrate tap and a VSS ground plane.

10. The method of claim 6, wherein providing the conductive path between the substrate tap and a ground metal layer comprises providing a CDM path.

11. A method of providing a ground path in an integrated circuit device, the method comprising:
 receiving a circuit design having a substrate tap adjacent to a device region formed in a substrate of the integrated circuit device and a conductive path extending between the substrate tap and a ground metal layer by way of a plurality of metal layers and vias of the integrated circuit device;
 associating traces in the metal layers of the conductive path with a CAD layer providing an electrostatic discharge protection circuit;
 extracting a resistance value associated with the conductive path;
 determining whether the resistance value associated with the conductive path is below a predetermined resistance value; and
 reconfiguring the circuit design if the resistance value associated with conductive path is not below the predetermined resistance value.

12. The method of claim 11, wherein determining whether the resistance value associated with the conductive path is below a predetermined resistance value comprises determining the resistance value associated with predetermined metal layers of the conductive path.

13. The method of claim 12, wherein determining the resistance value associated with predetermined metal layers of the conductive path comprises determining the resistance value associated with metal layers below a ground plane.

14. The method of claim 11, wherein receiving a circuit design having a conductive path between the substrate tap and a ground metal layer comprises receiving a circuit design having a conductive path between the substrate tap and a VSS ground plane.

15. The method of claim 14, wherein determining whether the extracted resistance value is below a predetermined resistance value comprises determining whether a resistance between the substrate tap and the VSS ground plane is below a predetermined resistance value.

16. The method of claim 11, wherein receiving a circuit design having a conductive path between the substrate tap and a ground metal layer comprises receiving a circuit design having a CDM path.

17. The method of claim 16, wherein the CDM path comprises a plurality of CDM metal layers that overlap.

* * * * *